United States Patent
Hansz et al.

[11] Patent Number: 5,250,780
[45] Date of Patent: Oct. 5, 1993

[54] APPARATUS FOR TREATING THE SURFACE OF WORKPIECES BY MEANS OF A PLASMA TORCH

[76] Inventors: Bernard Hansz, 28 Rue Marcel Charon, F-91710 Vert le Pett, France; Silvano Keller, Neumattweg 40 Charon, CH-5315 Bottstein, Switzerland

[21] Appl. No.: 755,892

[22] Filed: Sep. 6, 1991

[30] Foreign Application Priority Data

Sep. 7, 1990 [DE] Fed. Rep. of Germany ....... 4028482

[51] Int. Cl.$^5$ ............................................... B23K 9/00
[52] U.S. Cl. ........................ 219/121.49; 219/121.43; 219/121.48; 219/121.37; 427/446
[58] Field of Search ...................... 219/121.48, 121.43, 219/121.49, 121.59; 156/345; 427/34, 8, 423; 373/18-22

[56] References Cited

U.S. PATENT DOCUMENTS 4,505,945  3/1985  Dubust et al. .................. 219/121.49
4,845,334  7/1989  Stocks et al. .................... 219/121.59

*Primary Examiner*—Mark H. Paschall
*Attorney, Agent, or Firm*—Dykema Gossett

[57] ABSTRACT

The apparatus serves for treating workpieces by means of a plasma torch in a gaseous, preferably in an inert gaseous atmosphere. For this purpose, there is provided a gas-tight container and, in the interior of the container, a plasma gun as well as a cooling member for cooling the treated workpiece by a gaseous cooling medium stream. The cooling medium is a gas circulating in a closed circuit. Thus, the cooling gas can continuously used because heat is removed from the gas in a heat exchanger. A cooling operation can be realized in this way in temperature regions which are much higher than if liquefied gas is used.

7 Claims, 1 Drawing Sheet

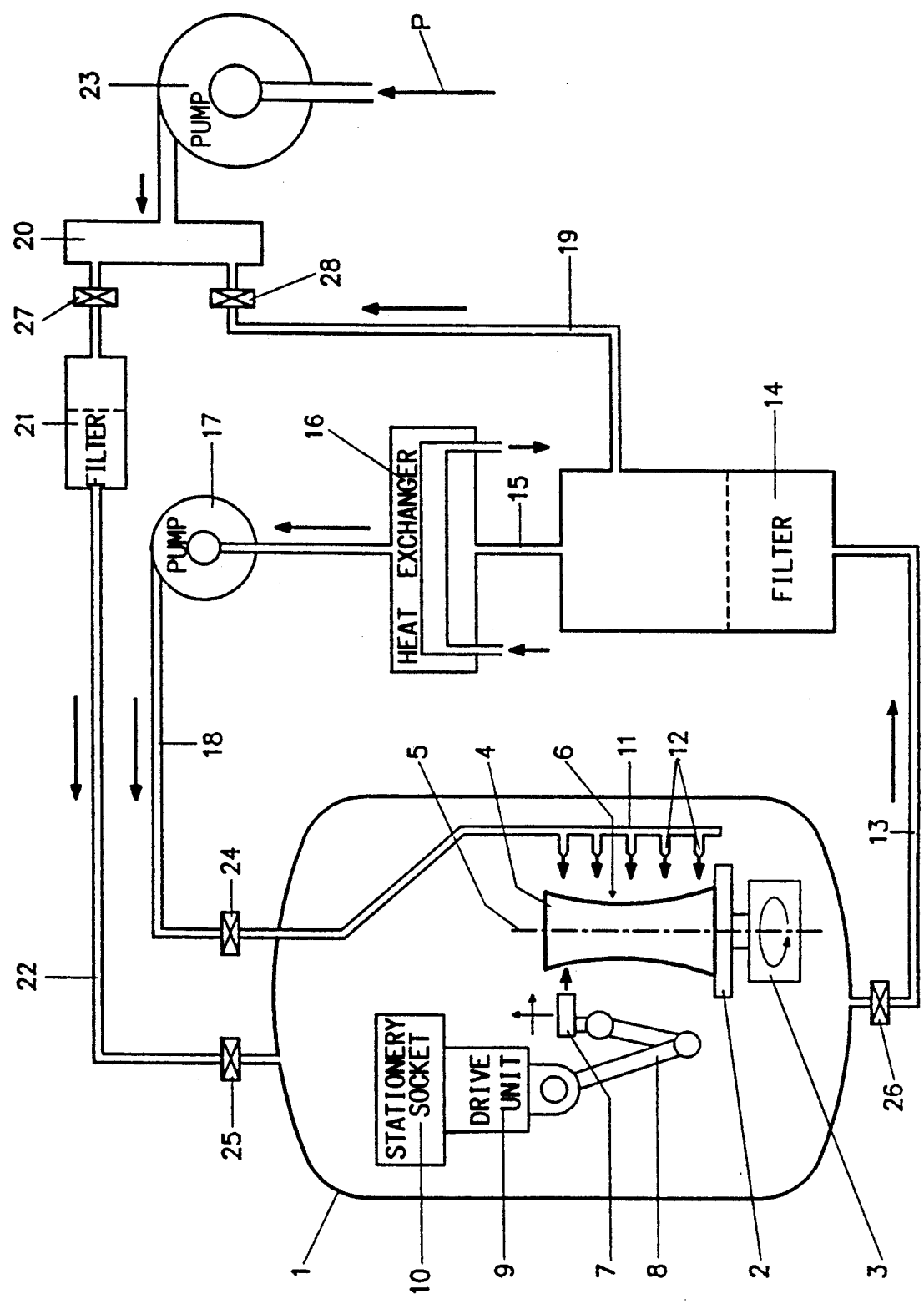

APPARATUS FOR TREATING THE SURFACE OF WORKPIECES BY MEANS OF A PLASMA TORCH

BACKGROUND OF THE INVENTION

1. Field of the Invention

The present invention refers to an apparatus for treating the surface of workpieces by means of a plasma torch. Such treatment is performed in an inert operating gas atmosphere and the workpieces to be treated are of a substantially thermically sensitive material. The apparatus of the invention comprises, according to the prior art, a work station having a plasma gun member and means for receiving a workpiece to be treated. A gastight container is provided enclosing said work station. Further, there are provided cooling means for cooling the surface of the workpiece to be treated. The cooling means includes a fluid cooling medium directed against the surface of the work piece to be treated.

Surfaces of workpieces, even surfaces of workpieces consisting of a thermo-sensitive material, as for example plastic materials, can be treated by means of a plasma torch. Such treatment may include providing a coating on the surface of the workpiece or preparing for such coating. However, it is essential that the surface portion of the workpiece which just has been treated and, thereby, has been heated up by the plasma torch, is cooled immediately after treatment by the plasma torch, e.g. by a stream of cooling gas directed towards the surface of the workpiece. Thus, it is possible to keep the surface temperature of the workpiece within safe limits with the result that the material structure of the workpiece is not altered and the workpiece will not be destroyed.

2. Prior Art

U.S. Pat. No. 4,675,205 discloses a method and an apparatus suitable to treat workpieces which are symmetric with regard to their central axis. This apparatus comprises a movable plasma gun producing a plasma stream directed to the surface of the workpiece to be treated. In order to cool the workpiece surface just treated by the plasma gun, a cooling member is provided which generates a cooling medium stream directed to the surface of the workpiece. This cooling member is movably mounted as well whereby the movements of the plasma gun and the cooling member are coordinated such that the operation area on the surface of the workpiece of the cooling medium stream immediately follows the operation area of the plasma torch on the surface of the workpiece.

As the region of movement of the plasma gun as well as of the cooling member is practically limited to a predetermined extent due to the connecting pipes and cables leading to the plasma gun and the cooling member, respectively, the workpiece to be treated is rotated while the path of movement of the plasma gun and the cooling member, respectively, runs only in a plane containing the rotation axis of the workpiece.

In this apparatus of the prior art, a cooling liquid is provided which has a temperature which is near its saturation temperature. Preferably, a liquefied gas, e.g. helium, nitrogen or argon is used as cooling liquid.

Practice has shown that in an apparatus according to the disclosure of U.S. Pat. No. 4,675,205 that a considerable throughput of cooling medium is required for an effective cooling of the workpiece to be treated, even if the temperature of the liquefied gas is extremely low and even if the cooling is performed only within a comparatively small surface area of the workpiece. Thereby, the movable cooling member comprises only one single output nozzle for the liquefied gas. The disadvantage of this design is that a very high consumption of the expensive cooling medium results and that the constructive measures for the control of the movement of the cooling member, i.e. such a control that it always follows the path of the plasma gun, are very demanding; thus, the costs for the operation of such an apparatus and the manufacturing costs of a cooling apparatus of this kind are very high.

OBJECTS OF THE INVENTION

It is an object of the invention to provide an apparatus for treating the surface of workpieces by means of a plasma torch which avoids the aforementioned disadvantages of the prior art.

It is a further object of the invention to provide an apparatus for treating the surface of workpieces by means of a plasma torch which comprises a cooling member for the workpiece to be treated by the plasma torch which is much simpler in design and does not need to be moved.

It is a still further object of the invention to provide an apparatus for treating the surface of workpieces by means of a plasma torch which comprises a cooling member for the workpiece to be treated by the plasma torch which does not need a continuous supply of fresh cooling medium and, thus, is much less expensive in operation.

SUMMARY OF THE INVENTION

To achieve these and other objects of the invention, the invention provides an apparatus for treating the surface of workpieces by means of a plasma torch, the treatment being performed in an inert operating gas atmosphere and the workpieces to be treated being of a substantially thermically sensitive material.

The apparatus of the invention comprises a work station having a plasma gun and means for receiving a workpiece to be treated whereby there is provided a gas-tight container enclosing said work station. Further, the apparatus comprises a stationary cooling member for cooling the surface of the workpiece to be treated, said cooling member including a fluid cooling medium directed against the surface of the work piece to be treated, said fluid cooling medium being a portion of said inert operating gas atmosphere contained in said container. The cooling member further comprises a cooling medium outlet member stationary arranged in the interior of the container and a closed cooling medium circulation circuit in which the portion of the inert operating gas circulates. The cooling medium circuit is connected, at the input side, to an outlet of the container and, at the outlet side, to the cooling medium outlet member.

The closed cooling medium circulation circuit has the advantage that the expensive cooling medium is not continuously lost but can cyclically re-used. Furthermore, For an effective cooling of the surface of the workpiece which has been subjected to the treating by the plasma gun, a cooling operation with not such extremely low temperatures of the gaseous or liquefied cooling medium as in the prior art is possible since a higher temperature can be compensated by increasing the throughput of the cooling gas, without an increase in consumption of the cooling medium.

With an increased throughput of cooling gas, it is also possible to design the cooling member arranged in the container simpler with regard to the prior art, particularly stationary. Thus, it is possible to design the cooling member such that the operating range thereof, i.e. the range where the cooling medium escapes from the cooling member, includes the entire operating range of the plasma gun without the need to move the cooling member. Such a cooling member can comprise a plurality of outlet nozzles for the cooling medium and can be stationary arranged within the container. Consequently, all means for moving and controlling the movement of the cooling member are not necessary.

Preferably, there is provided a second closed circulation circuit for the operating gas which serves to maintain the inert gas atmosphere in the interior of the container, said second closed circulation circuit being coupled to the circulation circuit for the cooling medium. If the second closed circulation circuit for the operating gas and the circulation circuit for cooling medium include means for purifying the gaseous medium circulating in said circuits, the gaseous atmosphere in the interior is continuously renewed.

In order to compensate for losses, e.g. due to leakage, the second closed circulation circuit for the operating gas and the circulation circuit for cooling medium are permanently or intermittently connected to an operating gaseous medium source.

The both circulation circuits differ, essentially, by the fact that the throughput in the cooling medium circuit is much higher than in the operating gas circuit. In order to realize the required throughput, at least the circulation circuit for cooling medium comprises a circulation pump. Furthermore, it is advantageous that the circulation circuit for cooling medium comprises a heat exchanger means for lowering the temperature of the fluid cooling medium to the desired value.

BRIEF DESCRIPTION OF THE DRAWING

In the following, an embodiment of the apparatus of the invention will be further explained, with reference to the accompanying drawing, in which a schematic diagram of the apparatus is shown.

DETAILED DESCRIPTION OF A PREFERRED EMBODIMENT

The main part of the apparatus shown in the drawing is a gas-tight container 1. In the interior of the container 1, an inert gaseous atmosphere is created and maintained during at least the duration of a single operation cycle, i.e. during the time in which a workpiece has to be treated by means of a plasma torch. However, it is also possible to admix to the inert gas or inert gas mixture a reactive gas, depending of the kind of treatment of the workpiece.

A rotatable socket 2 is provided in the interior of the container 1. A driving motor 3 is provided also in the interior of the container 1 which is operatively coupled to the socket 2 and adapted to rotate the socket with a desired rotation speed. A workpiece 4 to be treated is fixed to the socket 2 by not further shown means; such fixing means are well known in the art.

In the present example, the workpiece 4 is symmetric with reference to its vertical longitudinal central axis which is rotated, by means of the motor 3, around an axis 5 common to the workpiece 4, the socket 2 and the motor 3.

It is assumed that the jacket surface 6 of the workpiece 4 has to be treated by the plasma torch. For this purpose, there is provided a plasma gun member 7 the plasma stream thereof being directed towards the jacket surface 6 of the workpiece 4. The plasma gun member 7 is movable with regard to the rotation axis 5 in radial as well as in axial direction. Thus, the plasma gun member 7 can be displaced along a path corresponding to the shape of the jacket surface line of the workpiece 4 in constant distance from the jacket surface 6 of the workpiece 4. For this purpose, the plasma gun member 7 is mounted on the free end of a lever assembly 8 which is operationally connected to a driving unit 9 fixed to a stationary socket 10. Such a robot-like design is controlled by suitable control means (not shown) and is well known in the art; thus, the need to further describe this design is removed.

On the opposite side of the plasma gun member 7, with reference to the central axis 5 of the workpiece 4, there is provided a cooling member 11 which is stationary fixed with reference to the container 1. The cooling member 11 is operated with a cooling gas as set forth in detail hereinafter. The cooling member 11 comprises a plurality of cooling nozzles 12 equidistantially arranged one above the other one. Thereby, a stream of cooling gas is created which extends in the direction of the axis 5 over the entire height of the workpiece 4. Thus, the cooling member 11 has an operative region which comprises the entire area of the workpiece 4 to be treated by the plasma gun member 7.

The inert gas required for the operation of the apparatus of the invention, for example nitrogen, argon, helium or similar gases, or a mixture of these and similar gases, or a mixture of these and further gases, serves, according to the present example, for two purposes: First, the gas and gas mixture, respectively, is the operating gas with which the container 1 is filled in order to create and maintain a defined gas atmosphere environment in the interior of the gas tight container 1; second, it serves also as a gaseous cooling medium for the workpiece 4 to be treated by means of the plasma gun member 7.

Both the operation gas and the cooling gas circulate each in a circulation circuit, both circulation circuits being coupled to each other by means of a common outlet conduit 13. With other words, the gas and gas mixture, respectively, escape from the container 1 through the outlet conduit 13 and are led to a filter 14 in which the gas and gas mixture, respectively, are purified.

In a first circulation circuit, a part of the purified gas and gas mixture, respectively, i.e. the cooling gas and gas mixture, respectively, is fed through a conduit 15 to a heat exchanger 16 in which its temperature is lowered. The cooled gas and gas mixture, respectively, is fed by means of a pump 17 through a conduit 18 merging into the container 1 to the cooling member 11. It is understood that the pump is connected to a (not shown) control circuit in order to determine the amount of cooling gas fed to the cooling member 11 as required.

In a second circulation circuit, the other part of the purified gas and gas mixture, respectively, is fed through a conduit 19 into a collection chamber 20, therefrom through a second filter 21 and through a further conduit 22 into the container 1.

The gas and gas mixture, respectively, required to fill up the apparatus or required for the compensation of losses, is taken from a (not shown) source, symbolized by arrow P, and is fed via a pump 23 into the collection chamber 20.

In order to control the stream of gas into the container 1 and out of the container 1, a valve 24 is provided in conduit 18, a valve 25 is provided in conduit 22 and a valve 26 is provided in conduit 13. Further, there are provided valves 27 and 28 connected to the collection chamber 20 to regulate the amount of gas and gas mixture, respectively, fed to the conduits 22 and 18, respectively.

In practice, the apparatus further comprises means for sucking or collecting the gas and gas mixture, respectively, contained in the container 1 before the finished workpiece 4 is taken out of the container, and means by which the empty container 1 is cleaned with purified air during operation interrupts. All these means are not shown in the drawing since they are well known in the art and are not essential for the present invention.

What is claimed is:

1. An apparatus or treating the surface of a workpiece by means of a plasma torch, the treatment being performed in an inert operating gas atmosphere and the workpiece to be treated being of a substantially thermally sensitive material, said apparatus comprising:
   a work station having a plasma gun means and means for receiving the workpiece to be treated;
   a gas-tight container enclosing said work station;
   cooling means for cooling the surface of said workpiece to be treated, said cooling means including a fluid cooling medium directed against said surface of said workpiece to be treated, said fluid cooling medium being a portion of said inert operating gas atmosphere contained in said container;
   said cooling means further comprising a cooling medium outlet member stationary arranged in the interior of said container;
   a closed cooling medium circulation circuit in which said portion of said inert operating gas circulates, said cooling medium circuit being connected, at the input side, to an outlet of said container and, at the outlet side, to said cooling medium outlet member; and
   a second closed circulation circuit for the operating gas which serves to maintain the inert gas atmosphere in the interior of said container, said second closed circulation circuit being coupled to said circulation circuit for cooling medium.

2. An apparatus according to claim 1 in which said second closed circulation circuit for the operating gas and said circulation circuit for cooling medium include means for purifying the gaseous medium circulating in said circuits.

3. An apparatus according to claim 1 in which said second closed circulation circuit for the operating gas and said circulation circuit for cooling medium are permanently connected to an operating gaseous medium source.

4. An apparatus according to claim 1 in which said second closed circulation circuit for the operating gas and said circulation circuit for cooling medium are intermittently connected to an operating gaseous medium source.

5. An apparatus according to claim 1 in which said circulation circuit for cooling medium comprises a circulation pump.

6. An apparatus according to claim 1 in which said circulation circuit for cooling medium comprises a heat exchanger means for lowering the temperature of the fluid cooling medium.

7. An apparatus according to claim 1 in which said cooling medium outlet member creating said cooling stream has an operating range including the entire dimension of the workpiece to be treated.

* * * * *